US006638880B2

United States Patent
Yamamuka et al.

(10) Patent No.: US 6,638,880 B2
(45) Date of Patent: Oct. 28, 2003

(54) CHEMICAL VAPOR DEPOSITION APPARATUS AND A METHOD OF MANUFACTURING A SEMICONDUCTOR DEVICE

(75) Inventors: Mikio Yamamuka, Hyogo (JP); Takaaki Kawahara, Hyogo (JP); Masayoshi Tarutani, Hyogo (JP); Tsuyoshi Horikawa, Hyogo (JP); Shigeru Matsuno, Hyogo (JP); Takehiko Sato, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 180 days.

(21) Appl. No.: 09/981,824

(22) Filed: Oct. 19, 2001

(65) Prior Publication Data

US 2002/0023588 A1 Feb. 28, 2002

Related U.S. Application Data (62) Division of application No. 09/440,709, filed on Nov. 16, 1999, now Pat. No. 6,312,526.

(30) Foreign Application Priority Data

Jun. 3, 1999 (JP) .......................................... 11-156301

(51) Int. Cl.[7] .............................................. H01L 21/00

(52) U.S. Cl. ........................ 438/935; 118/715; 118/695; 118/698; 118/699; 118/703; 118/722; 156/345.1; 156/345.26; 156/345.24; 156/345.34

(58) Field of Search ................... 438/935; 118/715, 118/695, 698, 699, 703, 24, 25, 722; 156/345.1, 345.24, 345.26, 345.34; 137/2, 8

(56) References Cited

U.S. PATENT DOCUMENTS

| 4,844,758 A | 7/1989 | Hamamura et al. ............ 156/64 |
| 5,372,850 A | 12/1994 | Uchikawa et al. ...... 427/255.31 |
| 5,532,190 A | * 7/1996 | Goodyear et al. ........... 438/710 |
| 5,536,918 A | 7/1996 | Ohkase et al. ............... 219/390 |
| 5,556,476 A | 9/1996 | Lei et al. ..................... 118/728 |
| 5,669,976 A | 9/1997 | Yuuki et al. ................. 118/725 |
| 5,685,912 A | 11/1997 | Nishizaka .................... 118/719 |

(List continued on next page.)

FOREIGN PATENT DOCUMENTS

| JP | 61017151 A | 1/1986 | .......... G03G/5/082 |
| JP | 7-268634 | 10/1995 | |
| JP | 8-186103 | 7/1996 | |

OTHER PUBLICATIONS

JCS Kools, et al, "Gas Flow Dynamics in laser ablation deposition", J.App.Phys. 71(9), May 1992, 4547–4556.

S.M. Koch et al, "In Situ investigation of InAs metalographic CVD growth using reflectance anisotropy", J. App. Phys. 68(7), May 1992, 3364–3369.

Primary Examiner—Jeffrie R. Lund
Assistant Examiner—Rudy Zervigon
(74) Attorney, Agent, or Firm—McDermott, Will & Emery (57) ABSTRACT

In the chemical vapor deposition apparatus, a substrate stage for mounting a substrate is provided inside a reaction chamber of the apparatus. A source gas inlet for introducing a source gas and exhaust outlets and for exhausting the source gas are provided. Exhaust outlet valves provided for exhaust outlets are open and shut successively with time. The direction of the flow of source gas relative to the fixed substrate varies with time. The present chemical vapor deposition apparatus allows the improved evenness of film thickness, the composition ratio, and the like within the substrate surface as well as the reduction of particles of foreign substance generated inside the reaction chamber.

3 Claims, 9 Drawing Sheets

U.S. PATENT DOCUMENTS

| | | | |
|---|---|---|---|
| 5,853,607 A | 12/1998 | Zhao et al. | 252/8 |
| 5,972,116 A | 10/1999 | Takagi | 118/719 |
| 5,994,675 A | 11/1999 | Bethune et al. | 219/483 |
| 6,013,155 A | 1/2000 | McMillin et al. | 156/345 |
| 6,036,482 A | 3/2000 | Okase | 432/11 |
| 6,302,962 B1 * | 10/2001 | Nam et al. | 118/696 |
| 6,312,526 B1 * | 11/2001 | Yamamuka et al. | 118/720 |
| 6,399,510 B1 * | 6/2002 | Riley et al. | 438/710 |
| 6,428,850 B1 * | 8/2002 | Shinriki et al. | 427/255.32 |
| 6,444,039 B1 * | 9/2002 | Nguyen | 118/715 |
| 6,506,255 B2 * | 1/2003 | Kim | 118/715 |

* cited by examiner

CHEMICAL VAPOR DEPOSITION APPARATUS AND A METHOD OF MANUFACTURING A SEMICONDUCTOR DEVICE

"This application is a divisional of application Ser. No. 09/440,709 filed Nov. 16, 1999" now U.S. Pat. No. 6,312,526.

BACKGROUND OF THE INVENTION

1. Field of the Invention

The present invention relates to a chemical vapor deposition apparatus and a method of manufacturing a semiconductor device, and more specifically, to a chemical vapor deposition (CVD) apparatus for forming a dielectric film applied to a semiconductor memory device and a method of manufacturing a semiconductor device using the chemical vapor deposition apparatus.

2. Description of the Background Art

In recent years, increasingly higher degree of integration is being achieved in semiconductor memories and semiconductor devices at a great speed. For instance, a dynamic random access memory ()RAM) has undergone a rapid increase in the bit number: it has quadrupled in three years. The aims are to achieve higher degree of integration of the device, lower power consumption, lower cost, and so on. A capacitor, which is a component of a DRAM, however, is required to have a constant capacitance regardless of the improved degree of integration of the device.

One way of ensuring the capacitance of a capacitor is to create a thin capacitor insulating film. With the silicon oxide film ($SiO_2$) that has been used until now, however, there are limits as to how thin the film could be formed.

Consequently, as another way of ensuring the capacitance of a capacitor, the material for the capacitor insulating film has been changed. In other words, a thin film formed of a material having a high dielectric constant came to be utilized as the capacitor insulating film.

Oxide-type dielectric films as examples of high dielectric constant materials including, for instance, tantalum oxide, lead zirconate titanate (PZT), lead lanthanum zirconate titanate (PLZT), strontium titanate (ST), barium titanate (BT), barium strontium titanate ($[(Ba, Sr)TiO_3]$ hereinafter referred to as "BST"), and the like are being considered.

In order to form such oxide-type dielectric film as a thin film on a capacitor electrode of a DRAM having steps, it is advantageous to employ the CVD method which provides favorable coating onto a surface having a complex shape. In CVD method, a liquid source is used as a source for the thin film having a high dielectric constant. The liquid source is prepared by dissolving an organometallic complex containing a certain metal in an organic solvent. The liquid source is vaporized, and the resultant vapor is blown against the substrate to form a thin film having a high dielectric constant.

A significant problem has been, however, that a liquid source having a stable and good vaporization characteristic does not exist. This is mainly due to the poor vaporization characteristic, upon heating, of the compound of a metal and β-diketon-type dipivaloyl methane (DPM) frequently used as an organometallic complex.

Under these circumstances, the present inventors proposed a CVD source having a greatly improved vaporization characteristic by utilizing a liquid source prepared by dissolving a conventional organometallic complex in an organic solvent called tetrahydrofuran (THF: $C_4H_3O$) (Japanese Patent Laying-Open No. 7-268634).

It was discovered, however, that a dielectric film having a good quality such as a good electrical property could not always be consistently formed when the film was formed with this CVD source using a conventional CVD apparatus for liquid source. Thus, the present inventors proposed in Japanese Patent Laying-Open No. 8-186103 a CVD apparatus for liquid source which allows adequate vaporization of the liquid source and which supplies the vapor stably to the reaction chamber.

Figure 16:
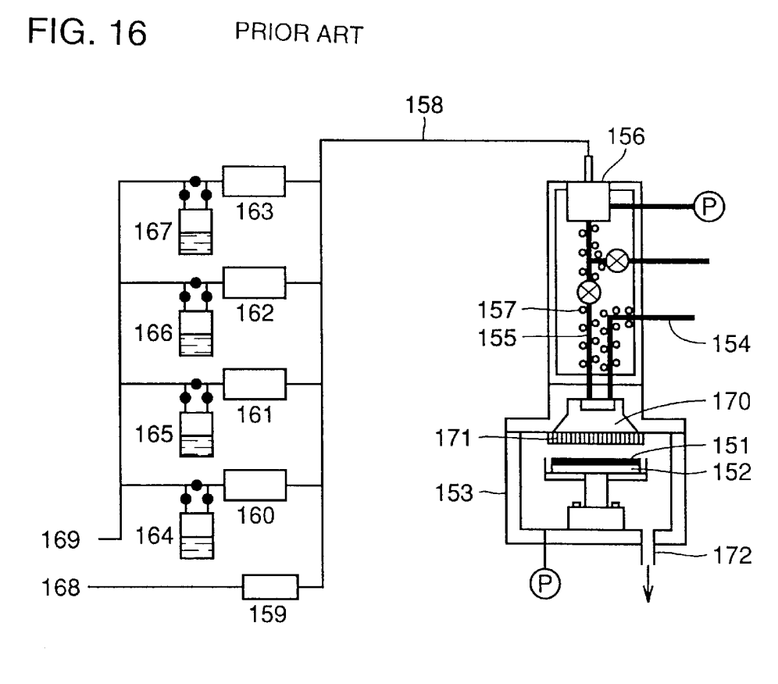
FIG. 16 is a diagram showing a configuration of a conventional CVD apparatus.

Now, the CVD apparatus for liquid source disclosed in the above Japanese Patent Laying-Open No. 8-186103 will be described with reference to the drawing. In FIG. 16, the CVD apparatus for liquid source is provided with liquid source vessels 164 to 167, liquid source flow rate control systems 160 to 163, a vaporizer 156, and a reaction chamber 153. Liquid source vessels 164 to 167 each store a liquid CVD source prepared by dissolving an organic complex containing a prescribed metal in an organic solvent.

To each of the liquid source vessels 164 to 167 a pressure tube 169 is connected, and through pressure tube 169 an inert gas such as nitrogen is fed into each of the liquid source vessels 164 to 167. Consequently, the pressure inside each of the liquid source vessels 164 to 167 rises, causing the liquid CVD sources to be supplied to vaporizer 156. Here, the flow rates are respectively controlled by liquid source flow rate control systems 160 to 163. In addition, a carrier gas such as nitrogen is introduced from a carrier gas feed inlet 168 in order to send the liquid CVD source via a connecting tube 158 to vaporizer 156. Here, the flow rate is controlled by a carrier gas flow rate control system 159.

Liquid CVD source, having reached vaporizer 156, is vaporized therein, and the resultant vapor flows through a source gas conveying tube 155 to a mixer portion 170. Conveying tube heaters 157 are provided around source gas conveying tube 155 to prevent the CVD source gas from turning back into liquid. The CVD source gas and oxygen supplied from an oxidizing agent feed line 154 are mixed in mixer portion 170. The CVD source gas mixed with oxygen is introduced into reaction chamber 153 via a source gas inlet 171, and thereafter, a thin film is formed on a substrate 151.

When forming a BST film as the thin film, liquid sources prepared by respectively dissolving in an organic solvent the organometallic complexes respectively containing barium (Bi), strontium (Sr), and titanium (Ti) were used. Oxygen ambient was provided inside reaction chamber 153, and the pressure was set between 1 and 10 Torr. The temperature of a substrate heater 152 was set to be in the range of 400° C. to 600° C. The flow rates of the liquid sources and the film deposition time were controlled such that the value of the BST film composition ratio (Ba+Sr)/Ti was 1.0. In this case, the film deposition rate was 3 nm/min.

As described above, liquid sources prepared by dissolving the DPM-type organometallic compounds in an organic solvent were used as the CVD sources. The source gas vaporized in vaporizer 156 is introduced into reaction chamber 153 via source gas inlet 171. At this time, a substantially steady flow of source gas from source gas inlet 171 directed to exhaust outlet 172 is formed in reaction chamber 153.

As a result, there was a problem of uneven distribution within the substrate surface regarding the thickness and the composition ratio of the BST film formed on substrate 151. More specifically, the film thickness tended to be relatively thick on the side where exhaust outlet 172 was provided. As regards the film composition ratio, the film tended to contain more titanium (Ti) than barium (Ba) or strontium (Sr) nearer to the exhaust outlet.

Moreover, the attempt to rotate the substrate to eliminate the unevenness within the substrate surface caused the problem of particle generation accompanied by the rotation.

Further, in the above-described CVD apparatus for liquid source, the source gas introduced from the inlet diffused inside reaction chamber 153 so that the vapor was not effectively brought onto substrate 151, which led to the problem of a low "use efficiency" or the ratio of the amount of the source gas contributing to film growth to the amount of the source gas supplied being low.

In addition, in a conventional CVD apparatus for liquid source, some of the heat from substrate heater 152 was absorbed by a wall of reaction chamber 153 having a low temperature so that a portion having a relatively low temperature was created within reaction chamber 153, causing the source gas introduced into reaction chamber 153 to condense in that portion. As a result, the condensed source gas was attached onto the substrate 151 as particles of foreign substance.

This, moreover, lead to another problem that the source gas could not be effectively brought onto substrate 151 due to the condensing of the source gas.

SUMMARY OF THE INVENTION

The present invention was made to solve the above problems. One object of the present invention is to provide a chemical vapor deposition apparatus allowing improved evenness of film thickness and film quality such as composition ratio within the substrate surface, with the substrate being fixed in position, while suppressing the generation of particles of foreign substance within the reaction chamber and increasing the use efficiency or the ratio of the source gas that contributes to film growth. Another object of the present invention is to provide a method of manufacturing a semiconductor device using such a chemical vapor deposition apparatus.

The chemical vapor deposition apparatus according to one aspect of the present invention is provided with a reaction chamber, a fixed stage portion, a blow inlet, and exhaust outlets. The fixed stage portion holds a substrate within the reaction chamber. The blow inlet introduces the source gas into the reaction chamber. The exhaust outlets exhaust the source gas having undergone the reaction from the reaction chamber. By causing the direction of the flow of the source gas introduced into the reaction chamber to vary with time, the direction of the flow of the source gas relative to the substrate also varies with time.

According to this configuration, as the direction of the flow of the source gas relative to the substrate varies with time while the substrate is fixed in position, improved evenness of film thickness and film quality such as composition ratio within the substrate surface is achieved. In addition, as the direction of the flow of the source gas within the reaction chamber varies with time, the product of reaction is kept from being attached to particular portions in the reaction chamber and the generation of particles within the reaction chamber can be suppressed. As a consequence, the number of particles of foreign substance being attached onto the substrate is reduced.

A specific method of varying the direction of the flow of the source gas within the reaction chamber with time preferably involves varying the direction to exhaust the source gas with time.

More preferably, the exhaust outlets are provided in at least two locations in the reaction chamber, and each exhaust outlet has an open and shut mechanism portion for opening and shutting each exhaust outlet successively with time.

In this case, the direction to exhaust the source gas is varied with time by opening and shutting the open and shut mechanism portions of the exhaust outlets so that the direction of the flow of the source gas can easily be changed.

More preferably, the open and shut mechanism portion for opening and shutting the exhaust outlet includes an open and shut valve.

In this case, opening and shutting the valve can easily change the direction of the flow of the source gas.

Preferably, the open and shut mechanism portion includes a ballast gas introducing mechanism portion for supplying a ballast gas into each exhaust outlet to prevent the source gas from flowing into each exhaust outlet.

In this case, the flow of the source gas into the exhaust outlet is prevented in the exhaust outlet where the ballast gas is supplied so that the source gas flows into the exhaust outlet that does not have the ballast gas supplied into it. By successively changing the exhaust outlet to supply the ballast gas into, the exhaust outlet that exhausts the source gas changes accordingly, and thus, the direction of the flow of the source gas within the reaction chamber can be varied with time.

In addition, the open and shut mechanism portion preferably includes a rotational shutter having an opening formed thereto and allowing to exhaust the source gas through that opening as the opening crosses each of the exhaust outlets by rotation.

In this case, the exhaust outlet to exhaust the source gas can be easily changed by the rotation of the rotational shutter having an opening formed thereto so that the direction of the flow of the source gas within the reaction chamber can easily be varied with time.

More preferably, a guiding plate portion for guiding the source gas from the blow inlet toward the substrate is provided.

In this case, the source gas does not diffuse inside the reaction chamber during its travel from the blow inlet to the substrate so that the source gas can positively reach the substrate, whereby the ratio of the source gas contributing to the film growth increases.

The chemical vapor deposition apparatus according to another aspect of the present invention is provided with a reaction chamber, a stage portion, a blow inlet, and a guiding plate portion. The stage portion holds the substrate in the reaction chamber. The blow inlet introduces the source gas into the reaction chamber. The guiding plate portion guides the source gas from the blow inlet toward the substrate.

According to this configuration, the source gas does not diffuse inside the reaction chamber during its travel from the blow inlet to the substrate so that the source gas can positively reach the substrate. As a result, the ratio of the source gas contributing to film growth increases.

The guiding plate portion can preferably be heated.

In this case, the source gas leaking out of the guiding plate portion can be prevented, and the amount of the source gas being attached to an inner wall of the reaction chamber can be reduced. As a result, the ratio of the source gas contributing to film growth increases even further while the generation of particles of foreign substance within the reaction chamber is successfully suppressed.

More preferably, a purge gas introduction portion for allowing a purge gas to flow between the reaction chamber wall and the guiding plate portion is provided.

In this case, diffusion of the source gas outside the guiding plate portion is prevented, and the ratio of the source gas contributing to the film growth is improved.

More preferably, the purge gas introduction portion includes a heating portion for heating the purge gas.

In this case, transfer of heat from inside the reaction chamber to the outside can be prevented, and formation of a portion having a relatively low temperature within the reaction chamber can also be prevented. As a result, the condensing of the source gas within the reaction chamber and the generation of particles of foreign substance that accompanies the condensing of the source gas can be reduced.

The method of manufacturing a semiconductor device according to still another aspect of the present invention includes the step of having a semiconductor substrate fixedly held inside the reaction chamber, and forming a prescribed film on the semiconductor substrate while varying the direction of the flow of the source gas relative to the semiconductor substrate by varying the direction of the flow of the source gas introduced into the reaction chamber with time.

According to this manufacturing method, as the direction of the flow of the source gas varies relative to the semiconductor substrate, evenness of the thickness and the composition ratio and the like of the prescribed film within the semiconductor substrate surface is improved. In addition, since the flow of the source gas within the reaction chamber changes with time, the amount of the product of reaction that are attached to particular portions inside the reaction chamber is reduced, and the number of particles of foreign substance falling onto the semiconductor substrate also decreases.

In particular, when barium strontium titanate (BST) film is formed as the prescribed film, improved evenness in thickness of the BST film and in the composition ratio of barium (Ba), strontium (Sr), and titanium (Ti) within the semiconductor substrate surface is achieved.

The source gas preferably is guided directly toward the semiconductor substrate.

In this case, the source gas positively reaches the semiconductor substrate so that the ratio of the source gas contributing to film growth increases.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the CVD apparatus for forming a thin film having a high dielectric constant according to the embodiments of the present invention, at least two exhaust outlets are provided in the reaction chamber. The direction to exhaust the source gas is varied with time by opening and shutting each of the exhaust outlets successively so that the direction of the flow of the source gas within the reaction chamber varies with time. Thus, evenness of film thickness and of film quality such as the composition ratio within the surface of the wafer, fixed in position, is improved.

In addition, in this CVD apparatus, a source gas guiding plate for guiding the source gas from the source gas inlet toward the substrate is provided so that the source gas positively reaches the wafer. Further, a heated purge gas is allowed to flow between the guiding plate and a wall of the reaction chamber so as to prevent the source gas from being attached to the wall of the reaction chamber.

Moreover, heat is kept from radiating outward from the reaction chamber so that use efficiency of the source gas is improved while the amount of particles of foreign substance as well as the generation of particles is reduced.

The chemical vapor deposition apparatus and the method of manufacturing a semiconductor device using the chemical vapor deposition apparatus according to the present invention is described below in detail.

First Embodiment

Figure 1:
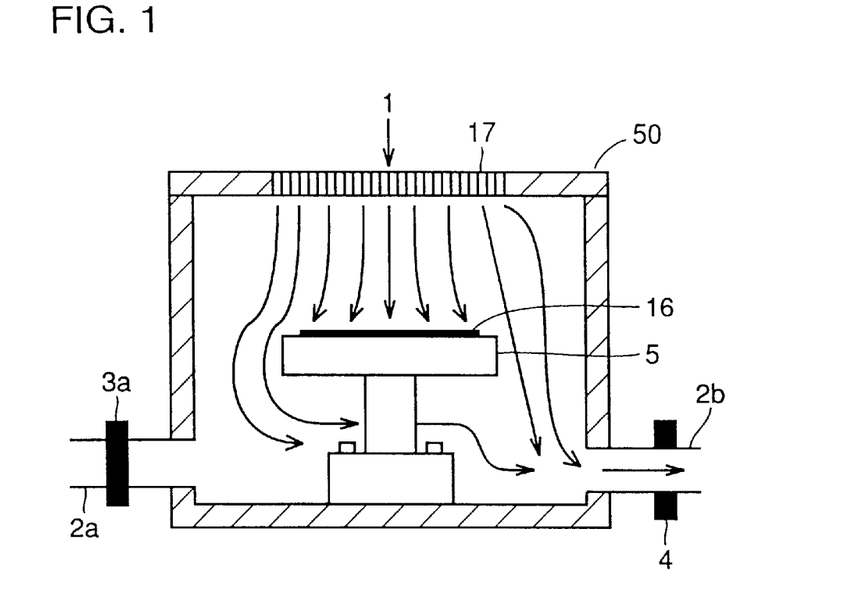
FIG. 1 is a cross sectional view showing a CVD apparatus according to the first embodiment of the present invention.
Figure 2:
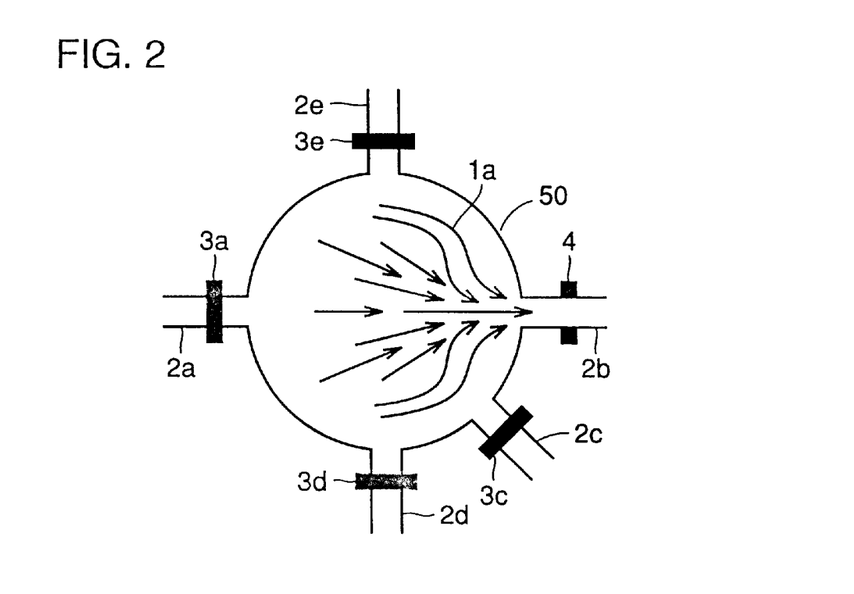
FIG. 2 is a schematic diagram illustrating the flow of gas inside the reaction chamber as seen from above in the CVD apparatus according to the first embodiment.

The CVD apparatus for forming a thin film having a high dielectric constant according to the first embodiment of the present invention will be described with reference to the drawings. As seen in FIGS. 1 and 2, a substrate stage 5 for fixedly mounting a substrate 16 thereon is provided in a reaction chamber 50 of the CVD apparatus. A source gas inlet 17 for introducing a source gas 1 into reaction chamber 50 is provided above substrate stage 5.

Moreover, a plurality of exhaust outlets 2a to 2e is provided in the lower portion of reaction chamber 50.

Exhaust outlet valves 3a, 3c to 3e, and 4 are provided for exhaust outlets 2a to 2e.

In the drawings, the elements besides reaction chamber 50, such as liquid source vessels for supplying source gas 1 and the vaporizer, are not shown since they are identical to those found in the CVD apparatus given in the section of the description of the background art.

Now, the operation of the above-described CVD apparatus will be described below. Source gas 1 introduced into reaction chamber 50 from source gas inlet 17 is blown against substrate 16 mounted on substrate stage 5. Then the source gas is let out from reaction chamber 50 via an exhaust outlet.

As described above, reaction chamber 50 is provided with a plurality of exhaust outlets 2a to 2e. Exhaust outlet valves 3a, 3c to 3e, and 4 provided for exhaust outlets 2a to 2e are successively opened and shut with time. For instance, in FIG. 2, exhaust outlet valves 3a, 3c to 3e provided for exhaust outlets 2a, and 2c to 2e are shut, whereas exhaust outlet valve 4 for exhaust outlet 2b is open.

Consequently, source gas 1 is let out from reaction chamber 50 via exhaust outlet 2b. Therefore, in this case, the source gas flows on substrate 16 toward exhaust outlet 2b as indicated by arrows 1a.

Thereafter, exhaust outlet valve 4 for exhaust outlet 2b is shut, and exhaust outlet valve 3e for exhaust outlet 2e, for example, is opened. Consequently, the source gas is caused to flow on substrate 16 toward exhaust outlet 2e, and thus, the change in the direction of the flow of source gas 1 relative to the fixed substrate 16 is effected.

In this manner, successively opening and shutting the exhaust outlet valves for the plurality of exhaust outlets 2a to 2e causes the direction of the flow of the source gas relative to the fixed substrate 16 to vary with time. As a result, with substrate 16 fixed in position, evenness of thickness and the composition ratio and the like, within the substrate surface, of the film formed on substrate 16 is significantly improved.

For instance, when forming a BST film on an 8-inch wafer used as substrate 16, the film thickness distribution within the wafer surface had improved, as represented by the value of standard deviation σ which was 10% with the conventional CVD apparatus having improved to 3% with the present CVD apparatus. Moreover, the value of standard deviation σ in the BST film composition ratio ((Ba+Sr)/Ti) distribution had improved from 10% to 5%.

In addition, the following effects were achieved with the present CVD apparatus by varying the direction to exhaust the source gas with time in order to vary the direction of the flow of the source gas relative to the fixed substrate 16.

Thus, since the flow of the source gas in reaction chamber 50 changed with time, the product of reaction was hardly found attached to a particular wall surface in reaction chamber 50. Moreover, in comparison with the instance in which substrate stage 5 was caused to rotate as a way of varying the direction of the flow of the source gas relative to substrate 16 with time, the generation of particles of foreign substance accompanied by the rotation of substrate stage 5 was prevented, and the number of particles of foreign substance being attached onto substrate 16 significantly decreased.

Second Embodiment

Figure 3:
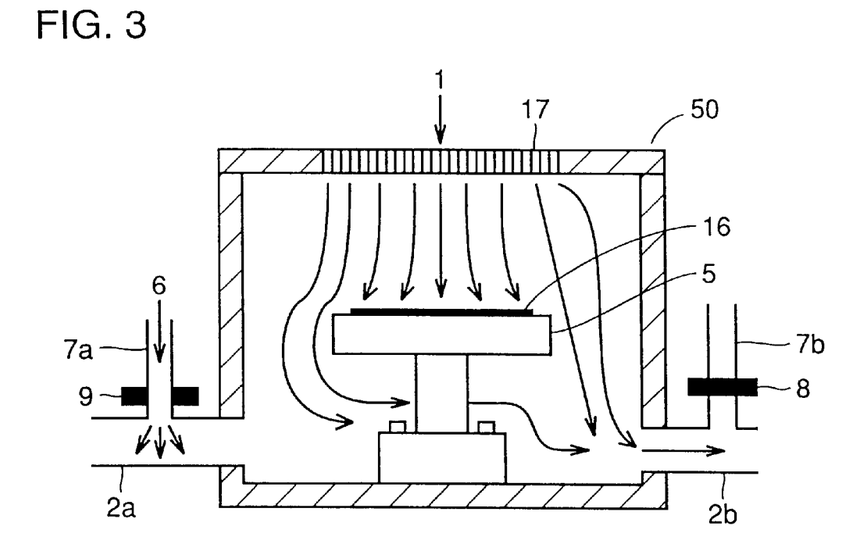
FIG. 3 is a cross sectional view showing a CVD apparatus according to the second embodiment of the present invention.
Figure 4:
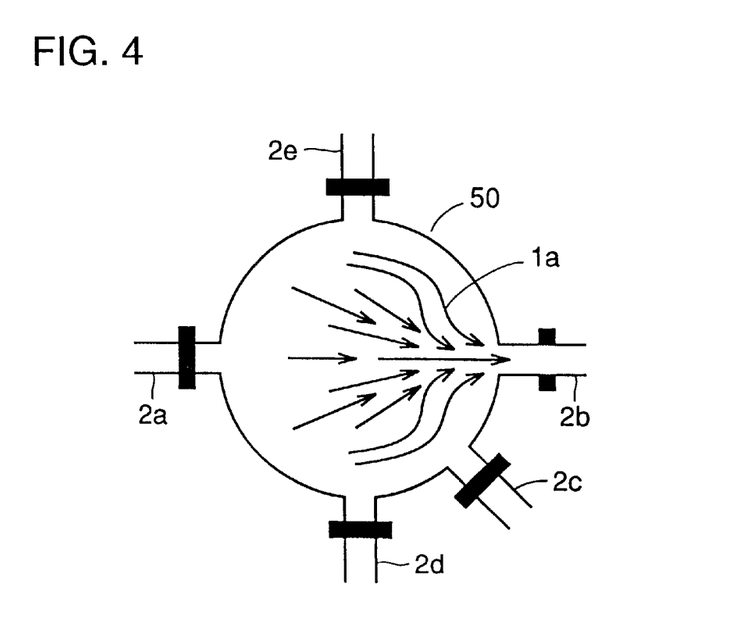
FIG. 4 is a schematic diagram illustrating the flow of gas inside the reaction chamber seen from above in the CVD apparatus according to the second embodiment.

The CVD apparatus for forming a thin film having a high dielectric constant according to the second embodiment of the present invention will be described with reference to the drawings. As seen in FIGS. 3 and 4, ballast gas lines 7a, 7b, etc. are provided to a plurality of exhaust outlets 2a to 2e provided in reaction chamber 50 to supply a ballast gas 6 into the respective exhaust outlets. Ballast gas line valves 8, 9, etc. are provided to the respective ballast gas lines 7a, 7b, etc. The remaining part of the configuration is identical to the configuration of the reaction chamber of the CVD apparatus described in relation to the first embodiment so that the same members are designated by the same reference characters and the descriptions thereof will not be repeated here.

Now, the operation of the above-described CVD apparatus will be described below. As mentioned above, ballast gas lines 7a, 7b, etc. are provided to the plurality of exhaust outlets 2a to 2e. By introducing ballast gas 6 into an exhaust outlet, the same effect as shutting the exhaust outlet is obtained.

For instance, in FIGS. 3 and 4, ballast gas line valve 9 of ballast gas line 7a is opened to exhaust outlet 2a, allowing ballast gas 6 to be supplied into exhaust outlet 2a. Exhaust outlets 2c, 2d, and 2e are in the same condition. As a result, a reaction gas 1 inside reaction chamber 50 hardly flows into exhaust outlets 2a, 2c to 2e.

On the other hand, ballast gas line valve 8 of ballast gas line 7b is shut so that the ballast gas is not supplied to exhaust outlet 2b. Thus, source gas 1 inside reaction chamber 50 is let out of reaction chamber 50 from exhaust outlet 2b. Therefore, in this case, the source gas flows on substrate 16 toward exhaust outlet 2b as indicated by arrows 1a.

Thereafter, ballast gas line valve 8 is opened, and the ballast gas line valve (not shown) for exhaust outlet 2e is shut. Thus, the source gas is caused to flow on substrate 16 toward exhaust outlet 2e.

Such operation performed successively causes the direction of the flow of the source gas within reaction chamber 50 to vary with time, which consequently causes the direction of the flow of source gas 1 relative to the fixed substrate 16 to vary with time. As a result, as described in relation to the first embodiment, evenness in film thickness and in film quality such as the composition ratio is significantly improved. In addition, particle generation inside reaction chamber 50 as well as the number of particles of foreign substance being attached onto substrate 16 is reduced.

As in the first embodiment, when forming a BST film on an 8-inch wafer, the value of standard deviation σ of the film thickness distribution within the wafer surface was improved from 10% to 3%. Moreover, the value of standard deviation σ of the composition ratio distribution within the wafer surface was improved from 10% to 5%.

Third Embodiment

Figure 5:
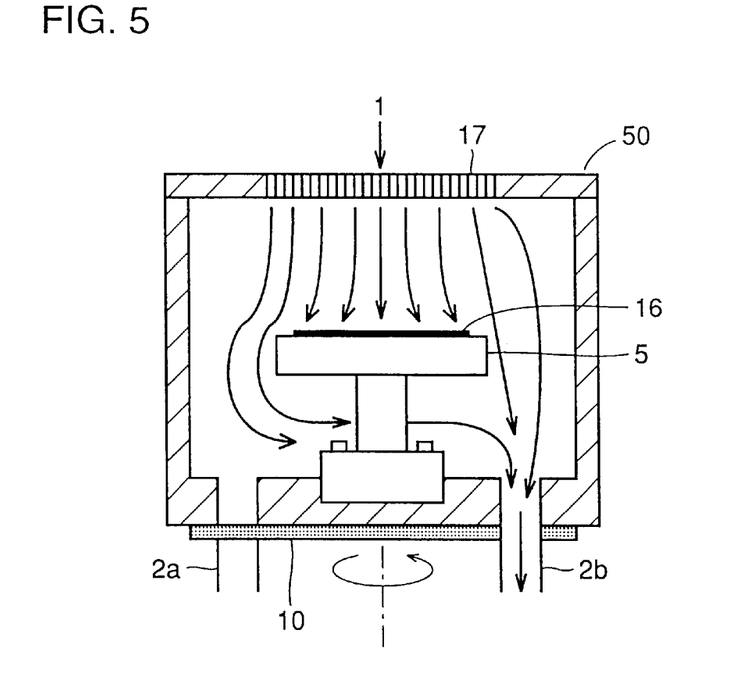
FIG. 5 is a cross sectional view showing a CVD apparatus according to the third embodiment of the present invention.
Figure 6:
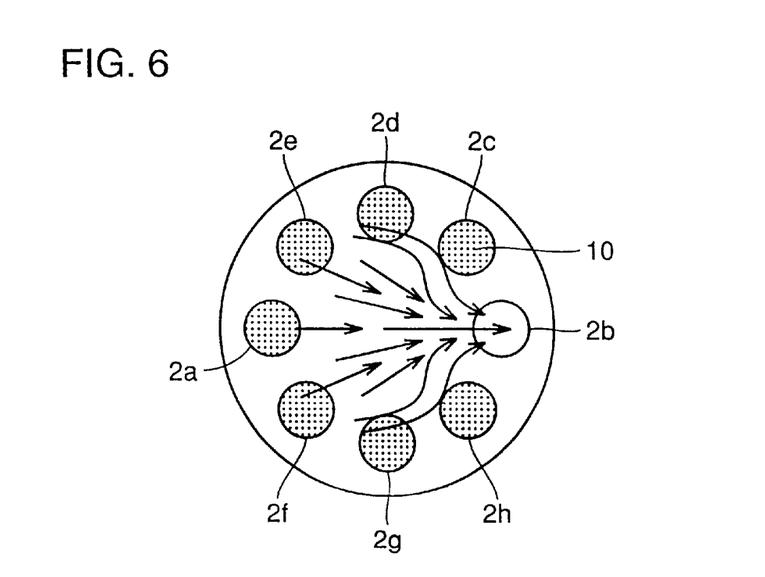
FIG. 6 is a schematic diagram illustrating the flow of gas inside the reaction chamber seen from above in the CVD apparatus according to the third embodiment.
Figure 7:
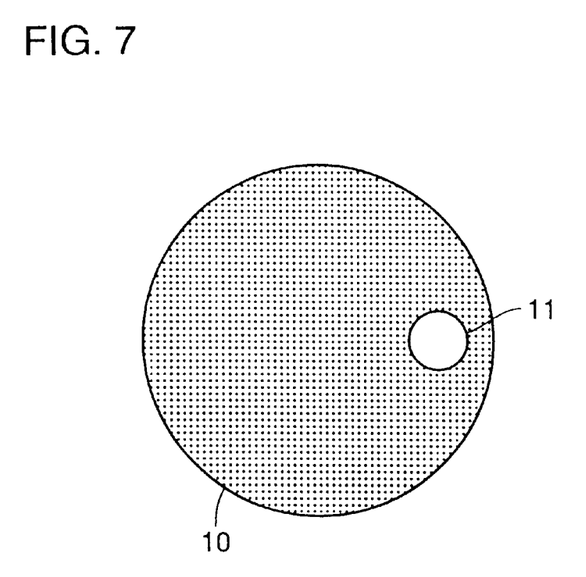
FIG. 7 is a plan view showing a rotational cover plate of the CVD apparatus according to the third embodiment.

The CVD apparatus for forming a thin film having a high dielectric constant according to the third embodiment of the present invention will be described with reference to the drawings. As seen in FIGS. 5 to 7, a plurality of exhaust outlets 2a to 2h and a rotational cover plate 10 having an exhaust hole 11 formed thereto are provided in the lower portion of reaction chamber 50. The remaining part of the configuration is identical to the configuration of the CVD apparatus described in relation to the first embodiment so that the same members are designated by the same reference characters and the descriptions thereof will not be repeated here.

Now, the operation of the above-described CVD apparatus will be described below. As shown in FIG. 5, rotational cover plate 10 rotates about a central axis. Exhaust hole 11 is provided to rotational cover plate 10, and the exhaust outlet is opened where exhaust hole 11 crosses the exhaust outlet, while the other exhaust outlets are shut.

For instance, in FIGS. 5 and 6, exhaust hole 11 is in the position of exhaust outlet 2b so that exhaust outlet 2b is open. At this time, source gas 1 inside reaction chamber 50 flows on substrate 16 toward exhaust outlet 2b. Thereafter, exhaust hole 11 moves to the position of exhaust outlet 2c, causing exhaust outlet 2b to shut. Thus, source gas 1 in reaction chamber 50 now flows on substrate 16 toward exhaust outlet 2c.

In this manner, the rotation of rotational cover plate 10 causes the direction to exhaust the source gas to vary with time, which consequently causes the direction of the flow of source gas 1 relative to the fixed substrate 16 to vary with time. As a result, as described in relation to the first embodiment, evenness of film thickness distribution and of composition ratio distribution within the substrate surface was significantly improved.

Fourth Embodiment

Figure 8:
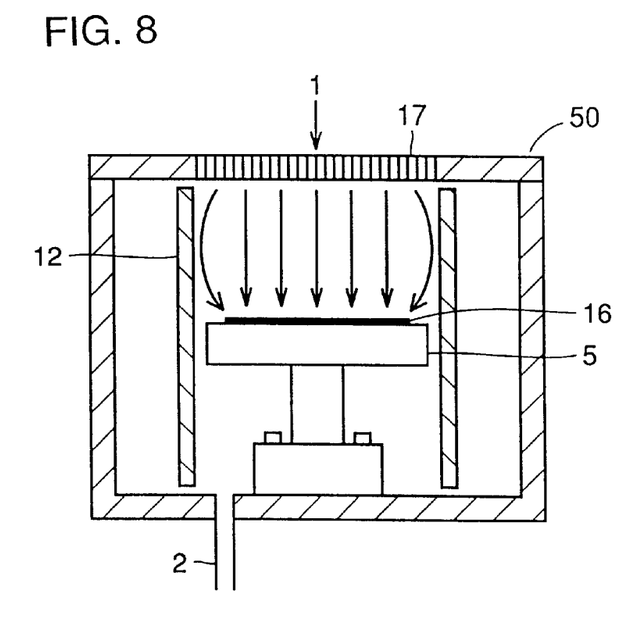
FIG. 8 is a cross sectional view of a CVD apparatus according to the fourth embodiment of the present invention.

The CVD apparatus for forming a thin film having a high dielectric constant according to the fourth embodiment of the present invention will be described with reference to the drawing. As seen in FIG. 8, a source gas guiding plate 12 is provided around stage 5 inside reaction chamber 50 to guide onto substrate 16 the source gas introduced from source gas inlet 17 into reaction chamber 50. The material for source gas guiding plate 12 is preferably an inert material which has a relatively high surface emissivity and which is easily raised in temperature, such as quartz ($SiO_2$) and silicon carbide (SiC). Further, an exhaust outlet 2 is provided in the lower portion of reaction chamber 50.

Now, the operation of the above-described CVD apparatus will be described below. Source gas 1 introduced from source gas inlet 17 is guided by source gas guiding plate 12 and directly reaches substrate 16. Thus, the source gas introduced into reaction chamber 50 is kept from diffusing inside reaction chamber 50 so that the ratio of the source gas contributing to film growth (use efficiency) is improved. More specifically, the use efficiency of 1% or less attained with a conventional CVD apparatus had improved up to about 4% with the present CVD apparatus.

Furthermore, source gas guiding plate 12 receives the radiant heat from the substrate heater (not shown) provided on substrate stage 5 and is brought to a prescribed temperature. Thus, the product of reaction is kept from being attached to source gas guiding plate 12, and the generation of particles within reaction chamber 50 is suppressed. A heater may be embedded in source gas guiding plate 12 to control the temperature of source gas guiding plate 12 to a prescribed temperature and to reduce the particle generation successfully.

Fifth Embodiment

Figure 9:
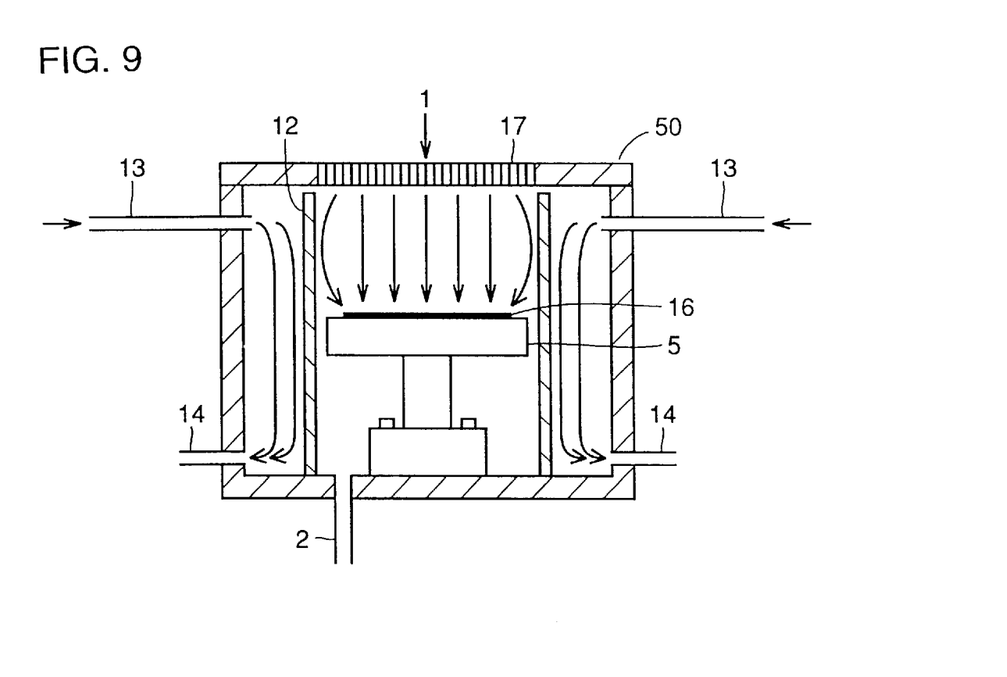
FIG. 9 is a cross sectional view of a CVD apparatus according to the fifth embodiment of the present invention.

The CVD apparatus for forming a thin film having a high dielectric constant according to the fifth embodiment of the present invention will be described with reference to the drawing. As seen in FIG. 9, a purge gas line 13 for supplying a purge gas between a sidewall of reaction chamber 50 and source gas guiding plate 12, and a purge gas exhaust outlet 14 are provided in reaction chamber 50. The remaining part of the configuration is identical to the configuration of the CVD apparatus described in relation to the fourth embodiment so that the same members are designated by the same reference characters and the descriptions thereof will not be repeated here.

Now, the operation of the above-described CVD apparatus will be described below. As shown in FIG. 9, by introducing the purge gas between the sidewall of reaction chamber 50 and source gas guiding plate 12, the source gas introduced from source gas inlet 17 can be kept from flowing out of source gas guiding plate 12. Thus, in addition to the use efficiency of the source gas being improved, the product of reaction being attached to the inner wall of reaction chamber 50 is further suppressed while the generation of particles within reaction chamber 50 is further reduced. Furthermore, the maintenance inside the reaction chamber becomes easier.

Sixth Embodiment

Figure 10:
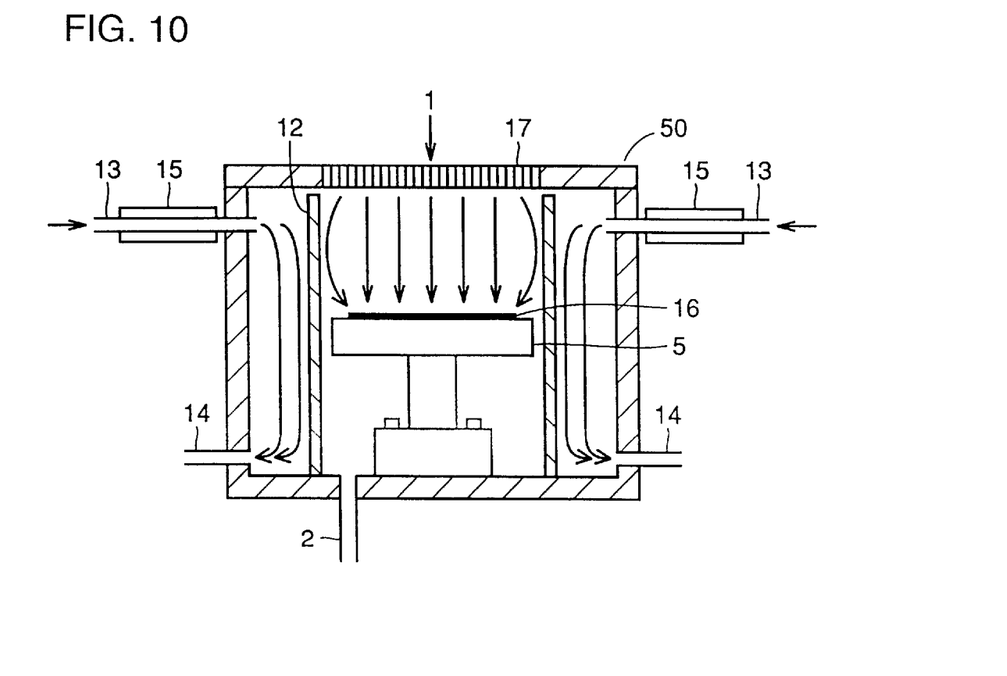
FIG. 10 is a cross sectional view of a CVD apparatus according to the sixth embodiment of the present invention.

The CVD apparatus for forming a thin film having a high dielectric constant according to the sixth embodiment of the present invention will be described with reference to the drawing. As seen in FIG. 10, a piping heater 15 is provided to purge gas line 13 so as to supply a heated purge gas into reaction chamber 50. The remaining part of the configuration is identical to the configuration of the CVD apparatus described in relation to the fifth embodiment so that the same members are designated by the same reference characters and the descriptions thereof will not be repeated here.

Now, the operation of the above-described CVD apparatus will be described below. A heated purge gas is supplied between source gas guiding plate 12 and a sidewall of reaction chamber 50. Thus, the variation in temperature distribution within reaction chamber 50 is made smaller, and the region of the portions having a relatively low temperature in reaction chamber 50 is reduced.

As a result, the source gas does not condense in such region and the particles of foreign substance falling onto the semiconductor substrate can be significantly reduced. More specifically, the number of particles of foreign substance at least 0.2 $\mu$m in size that exist on substrate 16 after the deposition of the BST film was reduced from the order of hundreds to the order of tens.

In particular, since a DPM-type organometallic compound when employed as a liquid source tends to decompose thermally at a temperature 10° C. to 20° C. higher than its sublimation temperature or its boiling point, the portions that come into contact with the source gas should be kept at a prescribed temperature. By controlling the respective temperatures of source gas guiding plate 12 and the purge gas to be within the prescribed range, the thermal decomposition of the source gas can be prevented.

Figure 11:
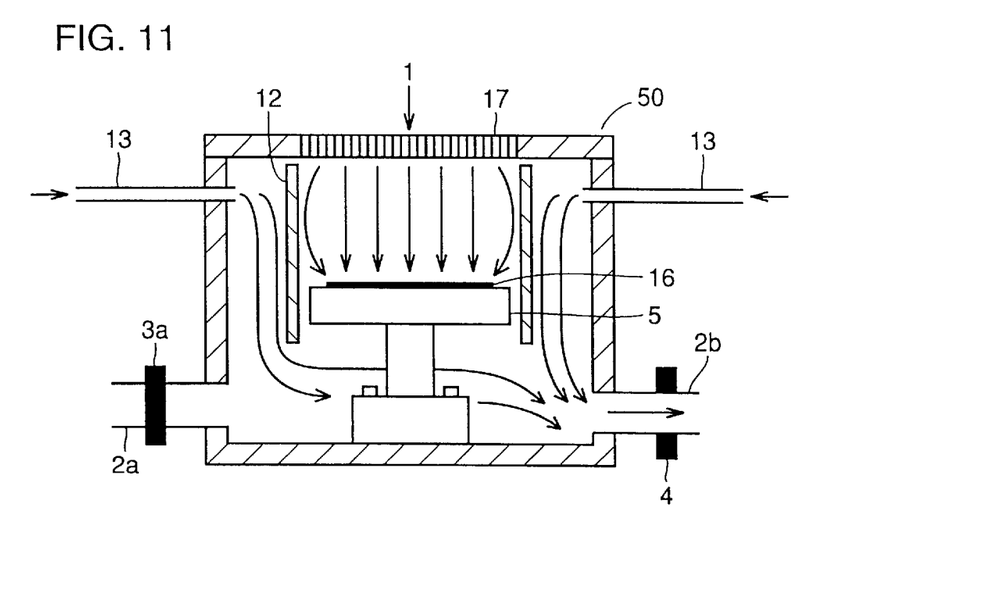
FIG. 11 is a cross sectional view illustrating a variation of the CVD apparatus according to the sixth embodiment.

A CVD apparatus may be configured by combining the CVD apparatus described in relation to the first embodiment with the CVD apparatus described in relation to the fifth embodiment, as shown in FIG. 11.

Figure 12:
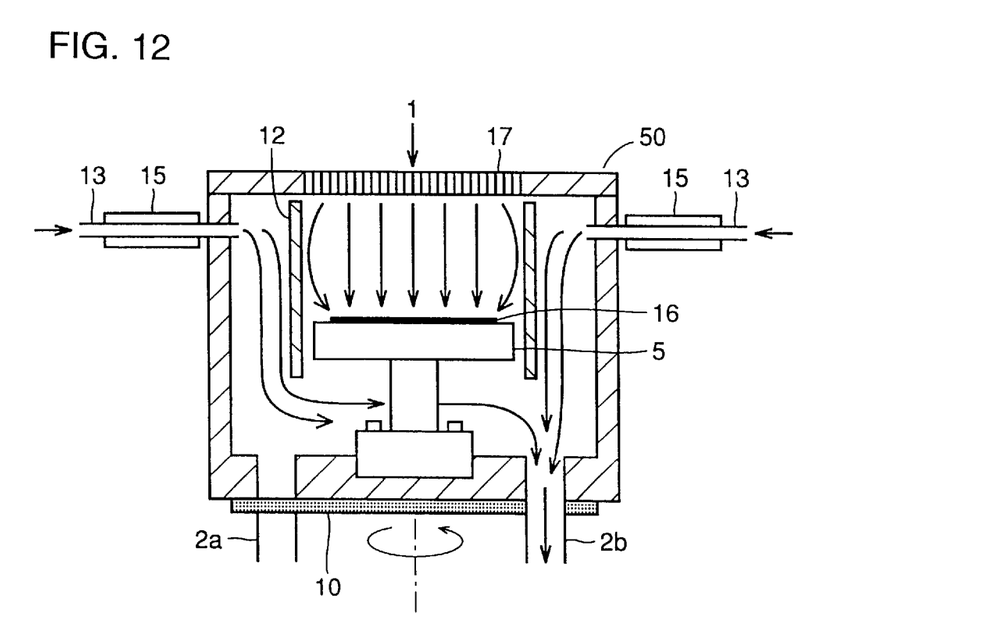
FIG. 12 is a cross sectional view illustrating another variation of the CVD apparatus according to the sixth embodiment.

In addition, as shown in FIG. 12, a CVD apparatus may be configured by combining the CVD apparatus described in relation to the third embodiment with the CVD apparatus described in relation to the sixth embodiment. With these CVD apparatuses, the effects such as the improved evenness of the film quality within the substrate surface and the reduction in the amount of particles of foreign substance are achieved as described in relation to the respective embodiments.

Further, in each of the above-described embodiments, the composition ratio of the BST film was evaluated using X-ray fluorescence spectroscopy. The thickness of the BST film was measured at 49 points in the region excluding the peripheral region of a width of 5 mm from the wafer edge.

Moreover, although nitrogen is used as the purge gas in the above embodiments, other inert gases such as argon or helium that do not affect the process of film growth may be employed.

Furthermore, for reasons of maintenance, it is desired that source gas guiding plate 12 can be detached to be cleaned. In addition, although source gas 1 is introduced into reaction chamber 50 from source gas inlet 17 provided above substrate 16 in the above embodiments, substrate 16 may be fixed inside reaction chamber 50 with its surface for film growth facing down, and source gas 1 may be introduced into the reaction chamber toward the substrate from below.

Seventh Embodiment

Now, as an example of a method of manufacturing a semiconductor device using the above-described CVD apparatus, a method of manufacturing a DRAM will be described with reference to the drawings.

Figure 13:
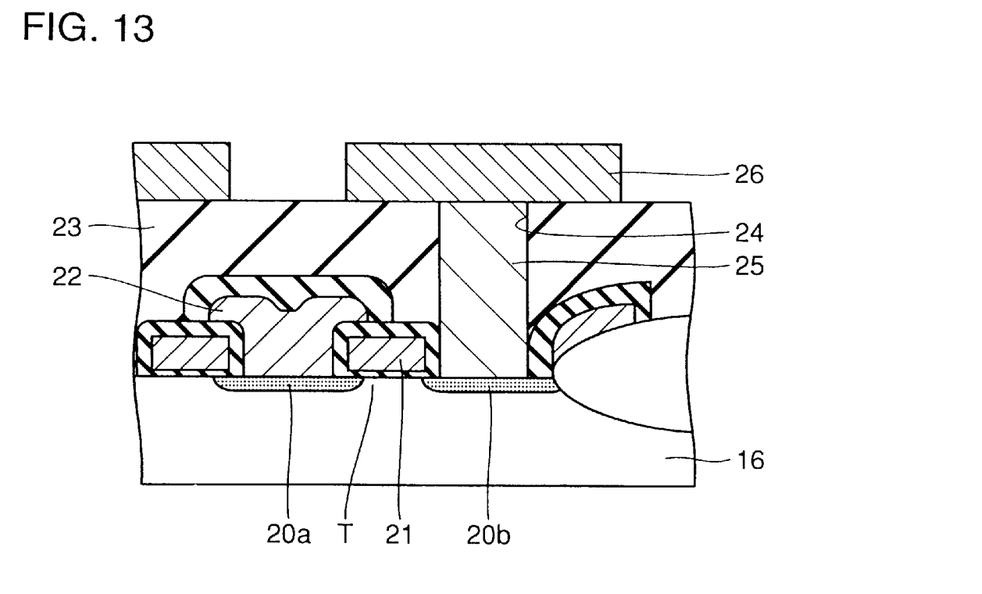
FIG. 13 is a cross sectional view illustrating a step in the method of manufacturing a semiconductor device according to the seventh embodiment of the present invention.

First, as shown in FIG. 13, an MOS transistor T including a gate electrode 21 and a pair of source/drain regions 20a and 20b is formed on a surface of a silicon substrate 16. On source/drain region 20a, a bit line 22 electrically connected thereto is formed. Then, an interlayer insulating film 23 such as a silicon oxide film is formed on silicon substrate 16 so as to cover MOS transistor T and bit line 22.

A contact hole 24 exposing a surface of source/drain region 20b is formed in interlayer insulating film 23. A doped polysilicon film 25, for instance, is formed so as to fill the contact hole 24. Then, a storage node 26 made of platinum, for example, and electrically connected to doped polysilicon film 25 is formed.

Figure 14:
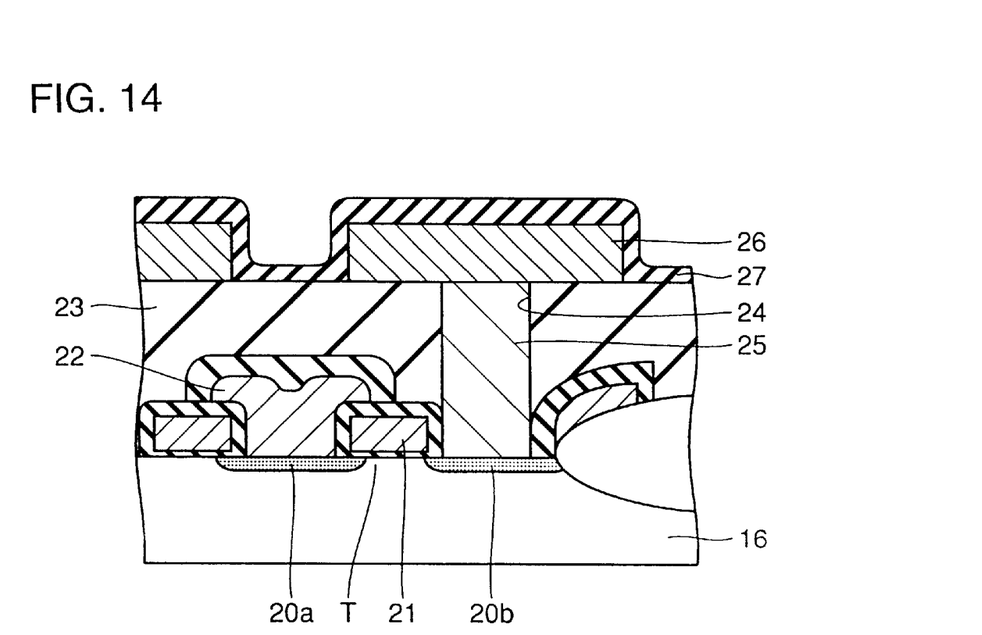
FIG. 14 is a cross sectional view illustrating the step following the step shown in FIG. 13 in the seventh embodiment.

Next, as shown in FIG. 14, silicon substrate 16 having undergone the process up to the formation of storage node 26 is mounted, for example, on a substrate stage 5 of the CVD apparatus shown in FIG. 1. Barium dipivaloyl methanate [Ba(DPM)$_2$], strontium dipivaloyl methanate [Sr(DPM)$_2$], and titanyl dipivaloyl methanate [TiO(DPM)$_2$] respectively dissolved in an organic solvent of tetrahydrofuran (THF) are used as liquid sources. Each liquid source in a prescribed amount is gasified, and the resultant source gas mixed with oxygen is introduced into reaction chamber 50.

Exhaust valves 3a, 3c to 3e, and 4 are successively opened and shut with time so that the direction of the flow of the source gas relative to the fixed silicon substrate 16 varies with time. As a result, a BST film having a highly even film thickness and composition ratio within the surface is formed over the entire surface of silicon substrate 16. Thereafter, a capacitor dielectric film 27 is formed from the BST film by performing prescribed photolithography and processing.

Figure 15:
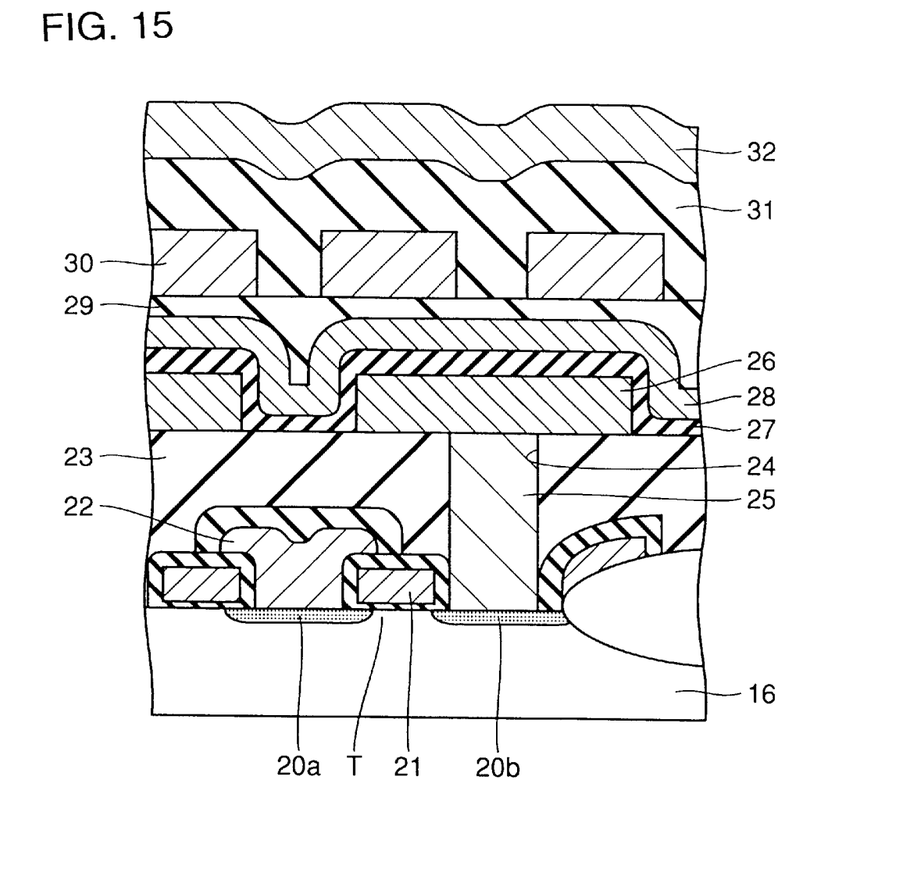
FIG. 15 is a cross sectional view illustrating the step following the step shown in FIG. 14 in the seventh embodiment.

Next, as shown in FIG. 15, a cell plate 28 made of platinum is formed covering capacitor dielectric film 27. An interlayer insulating film 29 such as a silicon oxide film is formed to cover cell plate 28. A first metal interconnection 30 is formed on interlayer insulating film 29, and an interlayer insulating film 31 is formed to cover the first metal interconnection 30. On interlayer insulating film 31, a second metal interconnection 32 is formed.

As described above, a DRAM including a memory cell having an MOS transistor T and a capacitor including storage node 26, capacitor dielectric film 27, and cell plate 28 is completed.

According to the above-described manufacturing method, a film having a high degree of evenness of film thickness and composition ratio within the surface of silicon substrate 16 is formed particularly when forming capacitor dielectric film 27 so that a prescribed capacitor with little variation in capacitance can be formed. As a result, the operation of the DRAM becomes stable.

Although the present embodiments were described in terms of forming a BST film using the above-described CVD apparatus, the present invention can be applied to deposition of films other than the BST film by the use of other types of source gases.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the step of having a semiconductor substrate fixedly held inside a reaction chamber, and forming a prescribed film on said semiconductor substrate while varying direction of flow of a source gas relative to said semiconductor substrate by varying direction of the flow of the source gas introduced into the reaction chamber with time.

2. The method of manufacturing a semiconductor device according to claim 1, wherein said prescribed film includes a barium strontium titanate [(Ba,Sr)TiO$_3$] film.

3. The method of manufacturing a semiconductor device according to claim 1, wherein the source gas is directly guided toward said semiconductor substrate.

* * * * *